US009397134B1

(12) United States Patent
Lewkow

(10) Patent No.: US 9,397,134 B1
(45) Date of Patent: Jul. 19, 2016

(54) METHODS AND DEVICES CONFIGURED TO PROVIDE SELECTIVE HEAT TRANSFER OF AN INTEGRATED CIRCUIT

(71) Applicant: Roman Lewkow, Mountain View, CA (US)

(72) Inventor: Roman Lewkow, Mountain View, CA (US)

(73) Assignee: Google Inc., Mountain View, CA (US)

( * ) Notice: Subject to any disclaimer, the term of this patent is extended or adjusted under 35 U.S.C. 154(b) by 501 days.

(21) Appl. No.: 13/761,932

(22) Filed: Feb. 7, 2013

(51) Int. Cl.
*H01L 27/146* (2006.01)

(52) U.S. Cl.
CPC .................................. *H01L 27/1464* (2013.01)

(58) Field of Classification Search
CPC ........................... H01L 27/3281; H01L 27/146
USPC ...................................... 62/3.2, 3.7
See application file for complete search history.

(56) References Cited

U.S. PATENT DOCUMENTS

| | | | | |
|---|---|---|---|---|
| 5,508,740 | A * | 4/1996 | Miyaguchi | H01L 23/34 257/E23.08 |
| 6,323,891 | B1 | 11/2001 | Kitani et al. | |
| 6,326,610 | B1 * | 12/2001 | Muramatsu | G01J 5/061 136/203 |
| 2004/0169771 | A1 * | 9/2004 | Washington | H04N 5/2253 348/374 |
| 2006/0151796 | A1 * | 7/2006 | Kobayashi | F25D 19/006 257/85 |
| 2006/0180758 | A1 * | 8/2006 | Troxell | G01J 5/02 250/338.1 |

OTHER PUBLICATIONS

SIDEVIEW, Sony Information Press Release; 201201/12-009E.*
www.sony.net/SonyInfo/New/press/201201/12-009E.*
Sony's Stacked CMOS Image Sensor Solves All Existing Problems in One Stroke, available at http://www.sony.net/Products/SC-HP/cx_news/vol68/pdf/sideview_vol68.pdf, accessed Dec. 2012.

* cited by examiner

*Primary Examiner* — Emmanuel Duke
(74) *Attorney, Agent, or Firm* — McDonnell Boehnen Hulbert & Berghoff LLP

(57) ABSTRACT

Methods and devices configured to provide selective heat transfer of a temperature-sensitive circuit are provided. In an example, a device comprises a thinned base substrate including an integrated circuit (e.g., back side illuminated (BSI) image sensor comprising a detector array area and a peripheral circuitry area). The device also comprises a supporting substrate comprising one or more thermoelectric structures. The supporting substrate may be coupled to the base substrate such that the one or more thermoelectric structures are aligned with the detector array area, and the thermoelectric structures may be configured to transfer heat away from the detector array area, while a reduced cross-section of a thinned base substrate may be configured to substantially reduce lateral heat flow across the base substrate and enable selective heat transfer.

17 Claims, 4 Drawing Sheets

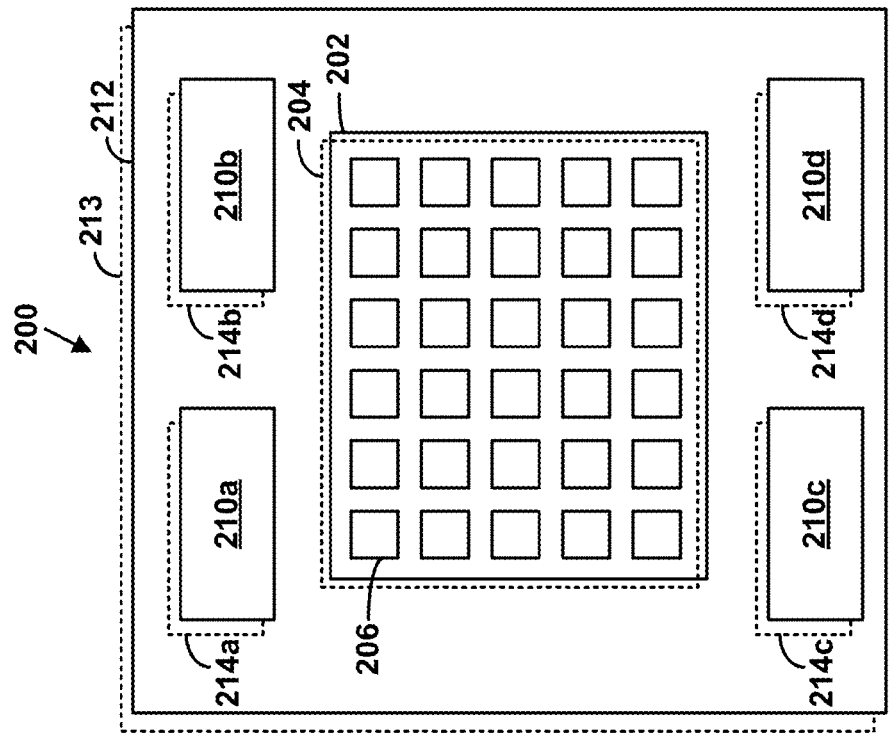
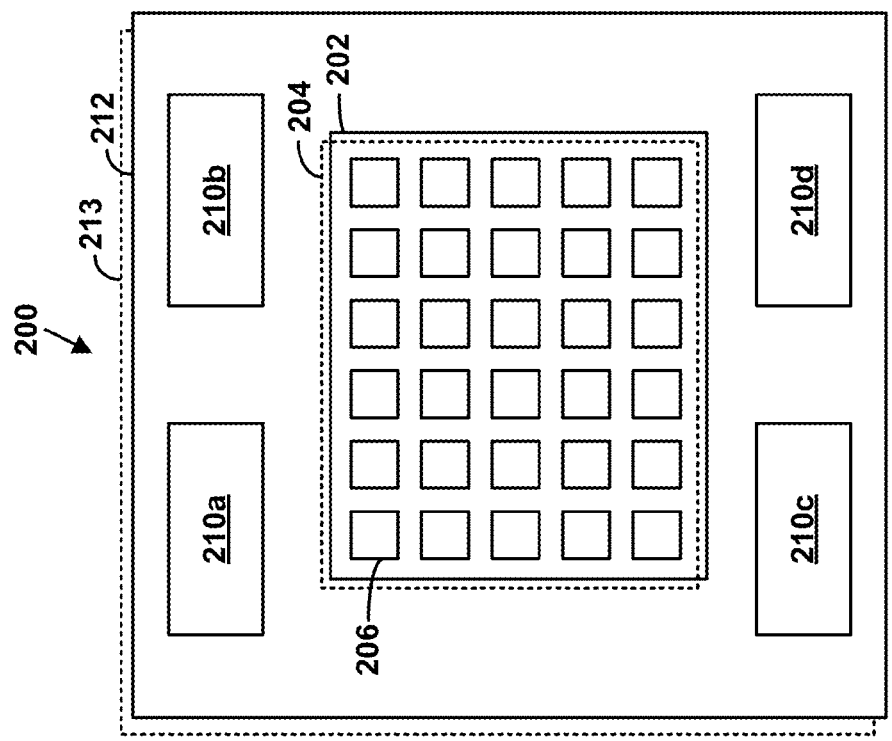

METHODS AND DEVICES CONFIGURED TO PROVIDE SELECTIVE HEAT TRANSFER OF AN INTEGRATED CIRCUIT

BACKGROUND

Unless otherwise indicated herein, the materials described in this section are not prior art to the claims in this application and are not admitted to be prior art by inclusion in this section.

Elevated temperatures can be detrimental to a performance of many electronic circuits (e.g., image sensors) because of effects on leakage currents, thermal noise, and device mismatch conditions. Image sensors include a detector array comprising pixel circuitry, and additional circuitry laid out on a substrate around the detector array. The detector array is usually more sensitive to temperature increases which affect performance of the detector array (e.g., temperature increases can cause increased leakage currents resulting in false image signal and degraded images).

Thermal management of image sensors and other integrated circuits has focused on removing heat from the entire image sensor. Such thermal management techniques can increase an amount of power required to remove heat due to heat dissipated by all circuits of the die. With small devices or handheld mobile devices, active cooling of image sensors can be problematic due to an amount of power to perform the thermal management techniques and constraints on power available in the mobile device. For example, transferring heat from the entire image sensor could require a few Watts or more of power in the system, which may not be available. This additional power may also cause excessive heating of the mobile device, which may not be acceptable.

In addition, cooling of image sensors in larger imaging devices has been performed using additional components. However, additional components can add to power requirements, as well as increase space requirements, which may not be acceptable in space-constrained systems, such as mobile devices. Imagers in mobile devices have been typically only passively cooled, and efficiency of this solution may be limited due to an adverse operating environment and severe constraints inside a mobile device.

SUMMARY

In one example, a device is provided that comprises a base substrate including an image sensor comprising a detector array area and a peripheral circuitry area. The device also comprises a supporting substrate comprising one or more thermoelectric structures, and the supporting substrate may be coupled to the base substrate such that the one or more thermoelectric structures are aligned with the detector array area. The thermoelectric structures may be configured to (e.g., selectively) transfer heat away from the detector array area.

In another example, an image sensor is provided that includes a base substrate including an image sensor comprising a detector array area and a peripheral circuitry area. The image sensor also includes a supporting substrate comprising one or more thermoelectric structures, and the supporting substrate is coupled to the base substrate such that the one or more thermoelectric structures are aligned with the detector array area. The thermoelectric structures are configured to (e.g., selectively) transfer heat away from the detector array area. The image sensor also comprises a heat isolation trench positioned between the detector array area of the base substrate and the peripheral circuitry area of the base substrate.

In still another example, a method is provided comprising providing a base substrate including an image sensor comprising a detector array area and a peripheral circuitry area, and providing a supporting substrate coupled to the base substrate such that one or more thermoelectric structures of the supporting substrate are aligned with the detector array area. The one or more thermoelectric structures are configured in a layout on the supporting substrate in a manner that substantially matches a layout of components of the detector array area of the image sensor. The method also includes transferring heat away from the detector array area by the thermoelectric structures.

In yet another example, a device is provided that comprises a base substrate including an image sensor comprising a detector array area and a peripheral circuitry area. The device also comprises means for (e.g., selectively) transferring heat away from the detector array area. In some examples, the device comprises means for selectively transferring heat away from the base substrate, such as to transfer heat away from the detector array area while not being concerned with heat of the peripheral circuitry area.

These as well as other aspects, advantages, and alternatives, will become apparent to those of ordinary skill in the art by reading the following detailed description, with reference where appropriate to the accompanying figures.

BRIEF DESCRIPTION OF THE FIGURES

FIG. 2A illustrates a top view of another example device that may be configured as an image sensor, with thermoelectric circuitry aligned with the detector array area.

FIG. 2B illustrates the device of FIG. 2A with additional thermoelectric circuitry aligned with additional circuits that may benefit from cooling.

DETAILED DESCRIPTION

Figure 1:
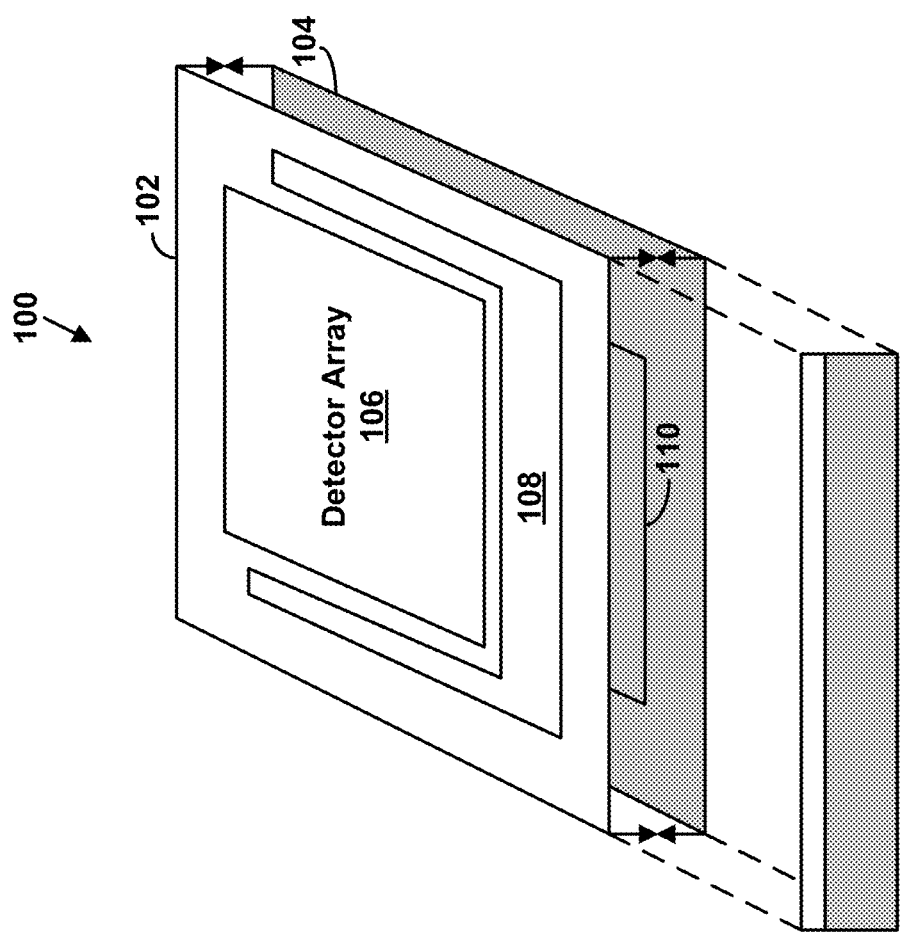
FIG. 1 illustrates an example device that may be configured as an image sensor.

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

Within traditional integrated circuit substrates, it may be difficult to accomplish selective cooling of a defined area of the substrate die due to a large lateral cross-section of the die (e.g., 0.7 mm-700 um or larger die thickness) combined with thermal conductivity of silicon that enable heat from peripheral circuits to flow freely into all areas of the die. In addition, for such thick substrates, it may be difficult to create thermal isolation structures (e.g., trenches) deep enough to be effective.

Example integrated circuits described herein are image sensors that include a detector array comprising pixel circuitry, and additional circuitry laid out on a substrate around the detector array. The detector array may be sensitive to temperature increases that can affect performance of the detector array (e.g., temperature increases can cause increased leakage currents resulting in false image signal and degraded images). A leakage current has been seen to approximately double with a 7-9 degrees Celsius rise in temperature of the detector array. Within examples, a structure is provided to manage and reduce a temperature of a detector array portion of the image sensor. The structure may not be concerned with reducing a temperature of any peripheral circuitry of the image sensor. Such a structure can reduce thermal load to be managed since the detector array area dissipates little heat compared to the peripheral circuitry. In addition, peripheral circuits that usually dissipate most of the heat within the image sensor are less sensitive to temperature increases than the detector array area, and thus, other heat management techniques may be used for the peripheral circuitry.

In addition, the structure may further be configured to include a thinned base substrate so as to reduce heat flow from the periphery to the detector array area based on a reduction in base substrate thickness, as well as additional thermal isolation elements provided in the structure. A reduced thickness of the base substrate reduces the lateral cross-section, thus reducing lateral heat transfer across the substrate. With such physical properties of the modified base substrate, selective cooling of heat sensitive areas may be accomplished without being overburdened by thermal load from other areas of the substrate.

Example devices described herein may be configured to provide heat transfer of a detector array. In one example, a device comprises a base substrate including a thinned (e.g., back side illuminated (BSI)) image sensor comprising a detector array area and a peripheral circuitry area. The device also comprises a supporting substrate comprising one or more thermoelectric structures. The supporting substrate may be coupled to the base substrate such that the one or more thermoelectric structures are aligned with the detector array area, and the thermoelectric structures may be configured to transfer heat away from the detector array area. Within examples, the substrate is described as a BSI, however, aspects of examples herein may be applied to other types of substrates or devices. Similarly, while examples herein describe image sensor devices, the aspects may be applied to any type of integrated circuit device.

In further examples, thermal isolation trenches may be created in the substrate that can be about a few micrometers deep (e.g., in some examples, prior to thinning of the base substrate) to further reduce lateral heat flow.

FIG. 1 illustrates an example device 100. The device 100 may be configured as an image sensor and includes a base substrate 102 and a supporting substrate 104. The base substrate 102 may be coupled to the supporting substrate 104 in any manner, such as using metal to metal bonding, for example.

The base substrate 102 includes a detector array 106 and peripheral circuitry 108. The detector array 106 may include elements arranged in a matrix and the elements may include pixels, photo-detectors, photo sensors, or a matrix of other photo elements.

The peripheral circuitry 108 may include any type of circuitry and may be coupled to the detector array 106 to support the operation of the detector array 106 and to process its outputs. Examples of types of circuitry which the peripheral circuitry 108 may include are power supplies, drivers, amplifiers, analog-digital converters, or other analog or digital circuitry.

The device 100 may be configured as a back side illuminated (BSI) image sensor, and the base substrate 102 may be relatively thin (e.g., a few micrometers), which can reduce lateral heat conduction. Thinning of the base substrate 102 may make the base substrate (e.g., silicon wafer) more fragile. In an example of a BSI sensor, the supporting substrate 104 is coupled to the base substrate 102 on a side opposite of a light receiving surface of the detector array 106 (i.e., a back side), and adds support or strength to the device 100. The supporting substrate 104 may be a handle substrate and may be further modified prior to packaging of the device 100. When non-imaging devices employ base substrate thinning to produce selective thermal management of selected circuits on a die, a support substrate may be used in the same manner as described in the example of BSI image sensors.

A difference in a coefficient in thermal expansion between different layers can cause the layers to separate, and thus, the supporting substrate 104, like the base substrate 102, may also be a silicon substrate. Since the supporting substrate 104 may be a silicon substrate, the supporting substrate 104 may also include circuitry. In the example shown in FIG. 1, the supporting substrate 104 includes thermoelectric circuitry 110. Other types of circuitry may be created on the supporting substrate 104 as needed, and the circuitry may be positioned in areas outside of the thermoelectric circuitry 110.

In the example shown in FIG. 1, the detector array 106 including pixels (sensors) and the peripheral circuitry 108 are formed on the same silicon substrate (e.g., the base substrate 102). The supporting substrate 104 may be coupled to the base substrate 102 in a manner such that the thermoelectric circuitry 110 are aligned with the detector array 106, and heat from the detector array 106 may be removed or transferred away by the thermoelectric circuitry 110. Heat dissipated by the peripheral circuitry 108 may be handled by other methods that do not drain power of a computing device in which the device 100 resides, for example. Thus, the thermoelectric circuitry 110 can be configured in a manner so as to selectively cool areas of the device 100.

In addition, thermal management is not limited to reducing temperature. The thermoelectric circuitry 110 may be configured to transfer heat in one or both directions (e.g., cooling and heating), and can be configured to cool or heat components of the device 100 as needed to optimize their operation (e.g., in varying ambient temperature).

The thermoelectric circuitry 110 may overlap the detector array area 106 without overlapping the peripheral circuitry 108 so as to provide selective thermal contact with only desired areas, for example. Such a configuration may cool portions of the image sensor 100 without being overloaded by heat from adjacent structures. The thermoelectric circuitry 110 can be sized to match a size of the detector array 106.

The device 100 may be configured using other types of substrates or may be configured for other applications. For example, any device that uses a thinned substrate may include the thermal management structures described herein. The examples herein describe a BSI image sensor, which may benefit from the thermal management due to thinning of the substrate to expose a bottom of photosensitive devices to incoming light, reduced temperature benefits for the detector array, and the BSI manufacturing process flow that already provides a handle substrate bonded to the active ("base") wafer, which can be configured to include active thermoelectric structures.

FIG. 2A illustrates a top view of another example device 200, which may be configured as an image sensor, for example. The device 200 includes a detector array 202 and thermoelectric circuitry 204 positioned underneath the detector array 202. The detector array 202 may include a number of photo sensors, such as photo sensor 206, which are configured to receive incident light. In FIG. 2A, the detector array 202 is shown to include a 6×5 array of photo sensors. The thermoelectric circuitry 204 includes thermoelectric structures, which may be of various shapes and sizes. In FIG. 2A, the thermoelectric circuitry 204 may comprise one or more thermoelectric structures, and the thermoelectric structures are positioned in a layout that matches (or substantially matches) a layout of the detector array area. Further, the thermoelectric circuitry 204 may be a different size (e.g., larger) than individual photo sensors in the detector array 202, and overlap may be of an area of the thermoelectric circuitry 204 and an area of the detector array 202.

The device 200 is also shown to include peripheral circuitry 210a-d that is positioned around the detector array 202, and each of the circuitry 210a-d may be coupled to the detector array 204 to send signals to or to receive outputs of the detector array 202. The detector array 202 can be positioned on a center portion of a base substrate 212 and the peripheral circuitry 210a-d can encompass a periphery portion of the base substrate 212 that surrounds one or more sides of the center portion. Thus, the circuitry 210a-d may be positioned on the same substrate as the detector array 204, and on a periphery of the substrate 212. The thermoelectric circuitry 204 may be positioned on a support substrate 213 underneath the base substrate 212, and the thermoelectric circuitry 204 may be configured so as not to overlap any of the peripheral circuitry 210a-d such that the thermoelectric circuitry 204 is operated to transfer heat away from the detector array 202.

FIG. 2B illustrates the device 200 with additional thermoelectric circuitry. For example, additional thermoelectric circuitry 214a-d may be provided on the support substrate 213 for some of the peripheral circuitry 210a-d. The thermoelectric circuitry 214a-d is shown as four discrete components, however, more or fewer components may be provided for each block of the peripheral circuitry 210a-d or not all blocks of peripheral circuitry 210a-d may be provided with thermoelectric circuitry. The thermoelectric circuitry 214a-d may be configured to transfer heat away from the peripheral circuitry 210a-d, and may be operated independently of the thermoelectric circuitry 204. In some examples, the thermoelectric circuitry 204 may be operated at all times due to sensitivity of the detector array 204 to heat, and the thermoelectric circuitry 214a-d can be operated at selected times when needed.

Although illustrated that the thermoelectric circuitry 214a-d is provided on a same substrate as the thermoelectric circuitry 204, the thermoelectric circuitry 214a-d may alternatively be provided on a separate substrate. The thermoelectric circuitry 214a-d may include the same type of components as the thermoelectric circuitry 204, such as Peltier structures or other active cooling components, or may be different and include other components such as other heat sinks for example, while retaining an ability of selective thermal management of specific areas 210a-d of the thinned base substrate 212.

In addition, heat isolation trenches (not shown) may be provided between the detector array 204 and the peripheral circuitry 210a-d on the base substrate 212 to impede the transfer of heat from the circuitry 210a-d to the detector array 204. In some examples, heat isolation trenches may be configured to surround the actively cooled blocks of peripheral circuitry 210a-d as well, serving the same purpose. In addition, additional heat isolation trenches may be provided on the support substrate 213 surrounding the thermoelectric circuitry 214a-d as well.

Figure 3:
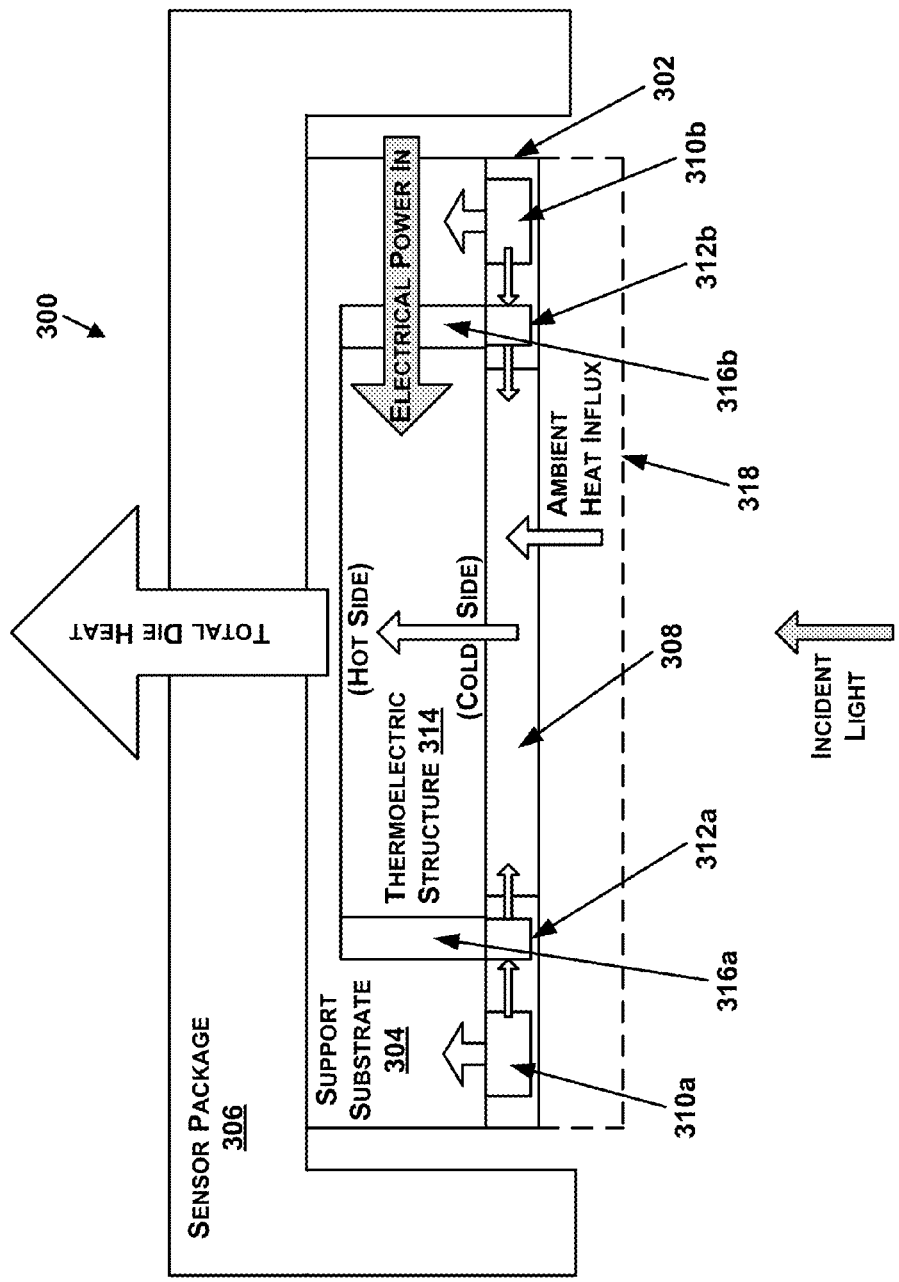
FIG. 3 illustrates a side view cross-section of another example device that may be configured as an image sensor.

FIG. 3 illustrates a side view of another example device 300, which may be configured as an image sensor, for example. The device 300 includes a base substrate 302 coupled to a support substrate 304, and the base substrate 302 and the support substrate 304 may be included within a sensor package 306. The sensor package 306 may include leads (not shown) for electrical connection to power and other inputs, and for providing outputs.

The base substrate 302 includes a temperature-sensitive circuit (e.g., pixel array) 308 and peripheral circuits 310a-b, and the pixel array 308 and the peripheral circuits 310a-b may be thermally isolated from each other on the base substrate 302 by heat isolation trenches 312a-b. The pixel array 308 may include any number of pixels depending on a size of the base substrate 302 and a size of the pixels, and the pixel array 308 may be located in a center portion of the base substrate 302. The peripheral circuits 310a-b may include any type of circuitry depending on an application of the device 300, and may be located around the pixel array 308 on the base substrate 302. The heat isolation trenches 312a-b may be a depth equal to the final thickness of base substrate 302, or less depth than that, as shown in FIG. 3. In some examples, the heat isolation trenches 312a-b and the heat isolation trenches 316a-b may not penetrate all the way through the base substrate 302 or the support substrate 304. The heat isolation trenches 312a-b may serve to prevent or lower lateral heat flow between the peripheral circuits 310a-b and the pixel array 308. In some examples, the heat isolation trenches 312a-b may be positioned in areas around the pixel array 308 on the base substrate 302, and may be between the pixel array 308 and the peripheral circuits 310a-b (e.g., the illustration in FIG. 3 is of a cross-section of the device 300; however, the heat isolation trenches 312a-b may be placed all around the pixel array 308).

The support substrate 304 includes thermoelectric circuitry such as a thermoelectric structure 314, and heat isolation trenches 316a-b that may be positioned around or surrounding the thermoelectric structure 314 on the support substrate 304, and may reduce a heat flow cross-section of the support substrate 304. In some examples, the support substrate 304 may be coupled to the base substrate 302 such that the heat isolation trenches 316a-b of the support substrate 304 are aligned with the heat isolation trenches 312a-b of the base substrate 302. In this manner, the thermoelectric structure 314 and the pixel array 308 may be isolated from the peripheral circuits 310a-b. Thus, the heat isolation trenches 316a-b may be positioned such that the thermoelectric structure 314 is thermally isolated from the peripheral circuits 310a-b. The heat isolation trenches 312a-b and the heat isolation trenches 316a-b may be vertical trenches and may be filled with lower thermal conductivity material, such as silicon dioxide, glass, or other materials of low thermal conductivity, or in some examples, the heat isolation trenches 312a-b and the heat isolation trenches 316a-b may be left as air gaps. The heat isolation trenches 312a-b may impede flow of heat from the peripheral circuits 310a-b to the pixel array 308. The heat isolation trenches 316a-b may impede heat flow from hot portions of the support substrate 304 to the cold side of the thermoelectric structure 314.

The heat isolation trenches 312a-b may also improve electrical isolation of the pixel array 308 from electronic noise generated by the peripheral circuits 310a-b. Still further, the heat isolation trenches 312a-b may also be useful as a defined grind-stop feature during the manufacturing process of the device 300.

The support substrate 304 may be coupled to the base substrate 302 such that the thermoelectric structure 314 is aligned with the pixel array 308 and overlaps the pixel array 308. The thermoelectric structure 314 has two sides, and when electrical power is provided to the thermoelectric structure, heat is transferred from one side of the structure to the other, so that one side becomes cooler while the other side becomes hotter. In some examples, the hot side of the support substrate 304 may be further attached to a heat sink or other structures so as to transfer the total device heat to the ambient.

In operation, the pixel array 308 is a low heat generation component due to low power consumption, while the peripheral circuits 310a-b generally are high (or higher) power dissipation components. Heat generated from the pixel array 308 and conducted from other parts of the die to the pixel array 308 flows to a cold side of the thermoelectric structure 314, which can be powered by using moderate amounts of additional electrical power to transfer the heat away from the pixel array 308. Heat from the peripheral circuits 310a-b is allowed to flow directly to the support substrate 304 (e.g., toward a periphery portion of the support substrate 304 around the thermoelectric structure 314) without causing an additional power penalty in the thermoelectric structure 314 since the thermoelectric structure 314 generally will not operate to cool the peripheral circuits 310a-b. In FIG. 3, heat flow is shown by non-shaded arrows.

In some examples, using the configuration of components shown in FIG. 3, heat load from the pixel array 308 is carried through the thermoelectric structure 314, while heat load from the peripheral circuits 310a-b is not. Lowering the amount of heat load at the thermoelectric structure 314 will also lower an amount of electrical power required by the thermoelectric structure 314 to move the heat, which lowers overall power consumption of the device 300.

The example device 300 shown in FIG. 3 illustrates the base substrate 302 coupled to the support substrate 304. The base substrate 302 may originally be thicker than as shown in FIG. 3, and an example original thickness is shown by the dotted lines at 318. During manufacturing, after creation of circuitry on the base substrate 302, the base substrate 302 may be bonded to the support substrate 304, and then thinned down to about a few micrometers thick. The base substrate 302 may originally be about 700 micrometers thick, and then thinned down to a few micrometers (e.g., in a range of 1-50 micrometers, or in a range of about 1-2 micrometers, 2-10 micrometers, 5-10 micrometers, or up to about 50-100 micrometers), which reduces a horizontal cross-section of the base substrate 302. Thinning of the base substrate 302, which includes the pixel array 308 and peripheral circuits 310a-b, helps to reduce lateral heat transfer from the peripheral circuits 310a-b to the pixel array 308 (less lateral heat conduction). Relatively thick silicon substrates may provide for an effective lateral thermal conductivity across the die, which distributes heat from periphery circuits throughout the entire device and may make selective cooling impractical. However, a thinned (e.g., BSI) device removes portions of the thick substrate (e.g., thinned down to a few micrometers from the surface), and so the lateral heat conduction in the remaining thin substrate may be substantially reduced. In addition, the isolation trenches 312a-b further thermally isolate the pixel array 308 from the peripheral circuits 310a-b and from the thermal load generated by the peripheral circuits 310a-b.

In addition, since the base substrate 302 may have a thickness reduced to a few micrometers, the base substrate 302 is shown mounted on the handling substrate 304 prior to the back-grinding process to provide for additional support or additional mechanical stability. The support substrate 304 has typically been a passive structure in BSI devices; however, using examples herein, the support substrate 304 incorporates the thermoelectric structure 314 that may substantially overlap the area of the pixel array 308.

Using the example configuration shown in FIG. 3, temperature of the temperature-sensitive circuit (e.g., pixel array 308) can be managed, and temperature of the peripheral circuits 310a-b can be handled by other means (i.e., avoid trying to transfer large amounts of heat through the active cooling device) so as to reduce the actively managed thermal load since the pixel array 308 dissipates little power and generates little heat. The peripheral circuits 310a-b usually dissipate more heat than the pixel array 308 on the device 300, however, the peripheral circuits 310a-b are also generally less sensitive to temperature increases. Thermal management can be selectively applied to only the pixel array 308 without being overwhelmed by thermal power dissipated in the peripheral circuits 310a-b.

In some examples, additional power distribution structures or digital processing blocks may be provided on the support substrate 304 to further enhance functionality of the device, which may not interfere with operation of thermoelectric structures described herein.

Figure 4:
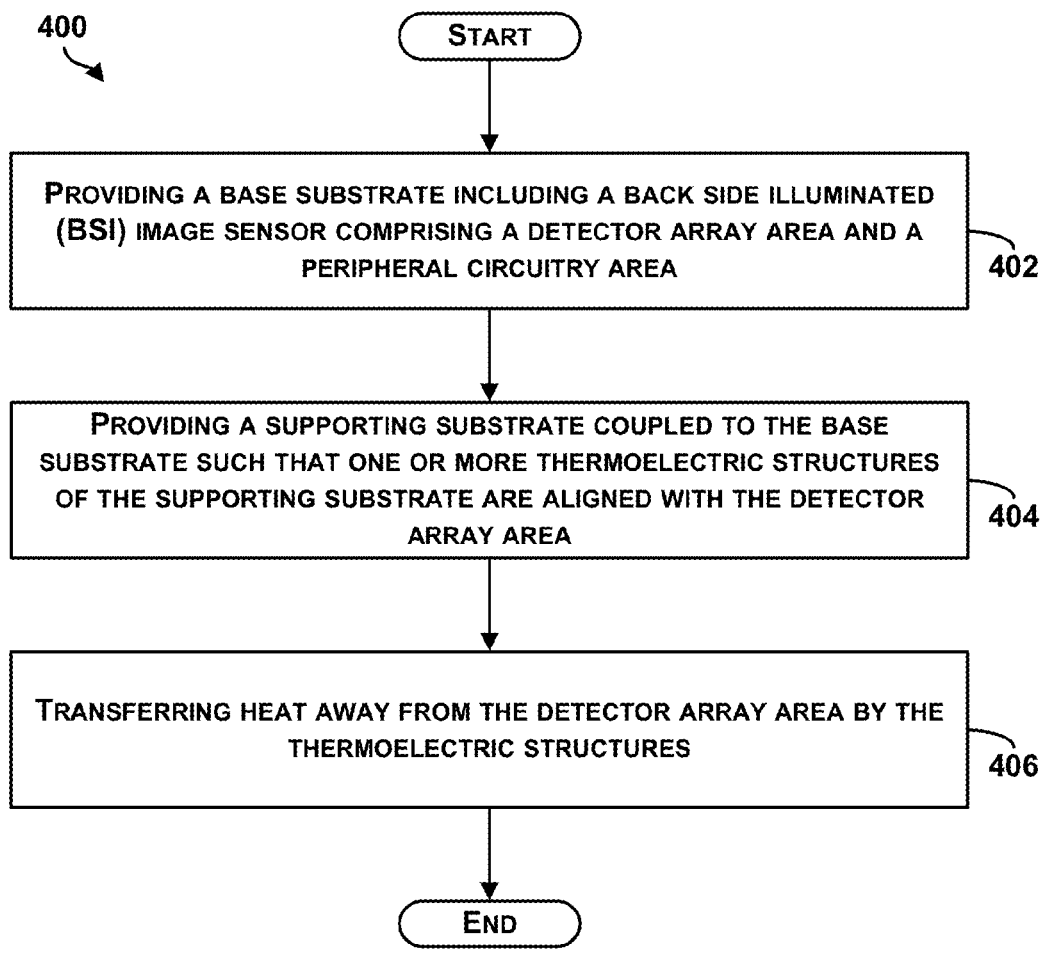
FIG. 4 is a block diagram of an example method for reducing heat of a device, in accordance with at least some embodiments described herein.

FIG. 4 is a block diagram of an example method for selectively reducing temperature of areas of a device, in accordance with at least some embodiments described herein. Method 400 shown in FIG. 4 presents an embodiment of a method that could be used with the devices 100, 200, and 300, for example. Method 400 may include one or more operations, functions, or actions as illustrated by one or more of blocks 402-406. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for the method 400 and other processes and methods disclosed herein, the flowchart shows functionality and operation of one possible implementation of present embodiments. In this regard, each block may represent a module, a segment, or a portion of a manufacturing or operation process.

At block 402, the method 400 includes providing a thinned base substrate including an integrated circuit (e.g., back side illuminated (BSI) image sensor comprising a detector array area and a peripheral circuitry area), such that lateral thermal conductivity of the base substrate is reduced. At block 404, the method 400 includes providing a supporting substrate coupled to the base substrate such that one or more thermoelectric structures of the supporting substrate are aligned with the temperature-sensitive circuits (e.g., detector array) area. The one or more thermoelectric structures may be configured in a layout on the supporting substrate in a manner that substantially matches a layout of the detector array area of the thinned image sensor. At block 406, the method 400 includes selectively transferring heat away from sensitive circuits (e.g., the detector array, voltage references, and others) by the thermoelectric structures. For example, heat may be transferred away from the sensitive circuits without being burdened by large thermal loads from the less sensitive peripheral circuitry that may be configured to produce most of the die power dissipation.

In some examples, the thermoelectric structures may be selectively operated, such as by powering or activating the thermoelectric structures at certain times. For instance, the thermoelectric structures may be operated based on a length of time of operation of the image sensor. After a certain amount of time of operation of the sensor, such as a few minutes, the thermoelectric structures may then be activated.

Using this function, the thermoelectric structures may be activated at times when there is heat being dissipated by the sensor (or when there is more heat being dissipated). In some instances, when the image sensor is idle and not being operated, power to the thermoelectric structures may be paused or dis-activated to lower power consumption of the device. In some instances, control of thermoelectric structures may be based on measurements of substrate temperature in die areas subject to selective thermal management as described herein. Operation of the thermoelectric structures may be controlled by power input to the thermoelectric structures, or by other components, circuitry, or processors coupled to the thermoelectric structures.

Within examples, the heat management techniques that are described for use in an image sensor structure can be applied to other electronic devices or other circuits that are sensitive to temperature changes. For example, an electronic integrated circuit may be thermally managed by bonding to a thermoelectric structure wafer, and then thinned to reduce lateral heat conduction as in BSI image sensors. In some examples, even in image sensors there are certain circuitry (other than the detector array) that could benefit from temperature control. Examples of such circuits include on-chip reference circuits, reference signal generators, and similar circuitry. Thus, example methods herein provide a selective thermal management to circuits that may be sensitive to temperature variations, of moderate intrinsic power dissipation, and co-located on a single die with higher power blocks. Imagers are just one example of such circuits, and even for imagers, for example, not only the detector array but also other blocks of periphery circuitry may benefit from selective cooling (e.g., some or all of circuits 210a-d in FIGS. 2A-2B).

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A device, comprising:
   a base substrate within which an image sensor resides comprising a detector array area and a peripheral circuitry area, wherein the image sensor is arranged on the base substrate such that the detector array area includes a center portion of the base substrate and the peripheral circuitry area encompasses a periphery portion of the base substrate that surrounds one or more sides of the center portion, and wherein the base substrate includes one or more heat isolation trenches that reside within the base substrate between the detector array area and the peripheral circuitry area; and
   a supporting substrate comprising one or more thermoelectric structures, wherein the one or more thermoelectric structures reside on a center portion of the supporting substrate, and wherein the supporting substrate is coupled to the base substrate such that the one or more thermoelectric structures are aligned with the center portion of the base substrate so as to align with the detector array area, wherein the thermoelectric structures are configured to transfer heat away from the detector array area.

2. The device of claim 1, wherein the base substrate of the image sensor includes a thinned base substrate having a thickness of about 2-10 micrometers.

3. The device of claim 1, wherein the base substrate includes a back side illuminated (BSI) image sensor.

4. The device of claim 1, wherein the supporting substrate is configured to include the one or more thermoelectric structures in a layout that substantially matches a layout of the detector array area of the image sensor.

5. The device of claim 1, wherein the detector array area includes an array of pixels, and wherein the supporting substrate at least includes a given thermoelectric structure for the array of pixels.

6. The device of claim 1, wherein the detector array area includes an array of pixels, wherein the one or more thermoelectric structures are configured to substantially match a size of the detector array area, and wherein the supporting substrate is coupled to the base substrate such that the one or more thermoelectric structures are configured to substantially match a position of the detector array area.

7. The device of claim 1, wherein the image sensor is configured to receive incident light through a first surface of the base substrate, and wherein the supporting substrate is coupled to a second surface of the base substrate that is opposite the first surface.

8. The device of claim 1, wherein the supporting substrate is coupled to the base substrate such that the one or more thermoelectric structures and the detector array area are substantially isolated from the peripheral circuitry area.

9. The device of claim 1, wherein the supporting substrate comprises a periphery portion that surrounds one or more sides of the one or more thermoelectric structures, and wherein the supporting substrate is coupled to the base substrate such that the detector array area transfers heat to the one or more thermoelectric structures and the peripheral circuitry area transfers heat to the periphery portion of the supporting substrate.

10. The device of claim 1, wherein the one or more thermoelectric structures comprise one or more Peltier structures.

11. The device of claim 1, wherein the supporting substrate is coupled to the base substrate such that the one or more thermoelectric structures do not overlap with the peripheral circuitry area.

12. The device of claim 1, further comprising additional thermoelectric circuitry aligned with some or all of the peripheral circuitry area of the base substrate.

13. An image sensor, comprising:
   a base substrate within which an image sensor resides comprising a detector array area and a peripheral circuitry area, wherein the image sensor is arranged on the base substrate such that the detector array area includes a center portion of the base substrate and the peripheral circuitry area encompasses a periphery portion of the base substrate that surrounds one or more sides of the center portion;
   a supporting substrate comprising one or more thermoelectric structures, wherein the one or more thermoelectric structures reside on a center portion of the supporting substrate, and wherein the supporting substrate is coupled to the base substrate such that the one or more thermoelectric structures are aligned with the center portion of the base substrate so as to align with the detector array area, wherein the thermoelectric structures are configured to transfer heat away from the detector array area; and a heat isolation trench positioned between the detector array area of the base substrate and the peripheral circuitry area of the base substrate.

14. The image sensor of claim 13, wherein the detector array area includes an array of photo sensors.

15. The image sensor of claim 13, further comprising one or more additional heat isolation trenches surrounding the one or more thermoelectric structures on the supporting substrate.

16. A method comprising:
providing a base substrate within which an image sensor resides comprising a detector array area and a peripheral circuitry area, wherein the image sensor is arranged on the base substrate such that the detector array area includes a center portion of the base substrate and the peripheral circuitry area encompasses a periphery portion of the base substrate that surrounds one or more sides of the center portion, and wherein the base substrate includes one or more heat isolation trenches that reside within the base substrate between the detector array area and the peripheral circuitry area;

providing a supporting substrate coupled to the base substrate such that one or more thermoelectric structures residing on a center portion of the supporting substrate are aligned with the center portion of the base substrate so as to align with the detector array area of the base substrate, wherein the one or more thermoelectric structures are configured in a layout on the supporting substrate in a manner that substantially matches a layout of components of the detector array area of the image sensor on the base substrate; and transferring heat away from the detector array area by the thermoelectric structures.

17. The method of claim 16, wherein the detector array area includes an array of pixels, and wherein the one or more thermoelectric structures are configured to substantially match a size of the array of pixels and the supporting substrate is coupled to the base substrate such that the one or more thermoelectric structures are configured to substantially match a position of the array of pixels.

* * * * *